(12) United States Patent
Kobayashi et al.

(10) Patent No.: US 10,491,837 B2
(45) Date of Patent: Nov. 26, 2019

(54) IMAGING METHOD, IMAGE SENSOR, AND IMAGING DEVICE (71) Applicant: Huawei Technologies Co., Ltd., Shenzhen (CN)

(72) Inventors: Atsushi Kobayashi, Kanagawa (JP); Juan Li, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 15/569,746

(22) PCT Filed: Jul. 9, 2015

(86) PCT No.: PCT/CN2015/083689
§ 371 (c)(1),
(2) Date: Oct. 26, 2017

(87) PCT Pub. No.: WO2017/004834
PCT Pub. Date: Jan. 12, 2017

(65) Prior Publication Data
US 2018/0131881 A1 May 10, 2018

(51) Int. Cl.
G01J 5/02 (2006.01)
H04N 5/33 (2006.01)
(Continued)

(52) U.S. Cl.
CPC ....... H04N 5/332 (2013.01); H01L 27/14621 (2013.01); H01L 27/14625 (2013.01);
(Continued)

(58) Field of Classification Search
CPC ........ H04N 5/332; H04N 5/228; H04N 5/335; H04N 5/2254; H04N 5/37457;
(Continued)

(56) References Cited

U.S. PATENT DOCUMENTS 8,405,751 B2 3/2013 Hibbeler et al.
2004/0240257 A1* 12/2004 Hollier ............... G11C 8/10
365/158
(Continued)

FOREIGN PATENT DOCUMENTS

CN 1342020 A 3/2002
CN 101179742 A 5/2008
(Continued)

OTHER PUBLICATIONS

Oik,"Trend of CMOS Imaging Device Technologies," Tokyo University (Jun. 25, 2004).

Primary Examiner — Kiho Kim
(74) Attorney, Agent, or Firm — Leydig, Voit & Mayer, Ltd.

(57) ABSTRACT

An image sensor includes: a filter array, a reading circuit, a controller, a converter and an image output interface, wherein: the controller is coupled to the reading circuit, the converter and the image output interface; the filter array comprises a plurality of color filter array patterns; each color filter array pattern comprises color filters and at least one infrared (IR) filter; the color filters are configured to capture visible rays; the IR filters are configured to capture IR rays; the reading circuit is configured to read out IR signals from the IR filters only or read out IR signals from the IR filters and color signals from a part of the color filters under control of the controller; the converter is configured to convert the IR signals into IR digital signals; the image output interface is configured to output the IR digital signals.

16 Claims, 8 Drawing Sheets (51) Int. Cl.
*H01L 27/146* (2006.01)
*H04N 5/378* (2011.01)
*H04N 5/345* (2011.01)
*H04N 5/3745* (2011.01)
*H04N 5/343* (2011.01)

(52) U.S. Cl.
CPC ............ *H04N 5/343* (2013.01); *H04N 5/3456* (2013.01); *H04N 5/378* (2013.01); *H04N 5/37457* (2013.01)

(58) Field of Classification Search
CPC ................. H04N 5/378; H04N 5/3456; H04N 27/14625; H04N 27/14621; H04N 31/0232
See application file for complete search history.

(56) References Cited

U.S. PATENT DOCUMENTS

| | | | |
|---|---|---|---|
| 2004/0256561 A1* | 12/2004 | Beuhler | G01J 3/2803 250/339.05 |
| 2008/0111894 A1 | 5/2008 | Tanimoto et al. | |
| 2010/0033611 A1 | 2/2010 | Lee et al. | |
| 2010/0245648 A1* | 9/2010 | Tayanaka | H04N 5/2254 348/308 |
| 2011/0127408 A1 | 6/2011 | Yanagita et al. | |
| 2011/0260059 A1 | 10/2011 | Jiang et al. | |
| 2014/0333814 A1 | 11/2014 | Tashiro et al. | |
| 2014/0340287 A1* | 11/2014 | Achilefu | A61B 19/56 345/8 |
| 2015/0163418 A1 | 6/2015 | Chen et al. | |
| 2015/0304638 A1* | 10/2015 | Cho | G01S 17/89 348/46 |

FOREIGN PATENT DOCUMENTS

| | | | |
|---|---|---|---|
| CN | 102595064 A | | 7/2012 |
| CN | 104702924 A | | 6/2015 |
| CN | 104735427 A | | 6/2015 |
| EP | 1176807 A1 | | 1/2002 |
| GB | 2520726 A | | 6/2015 |
| JP | 2005-006066 | * | 1/2005 |
| JP | 5564909 B2 | | 8/2014 |

\* cited by examiner

IMAGING METHOD, IMAGE SENSOR, AND IMAGING DEVICE

CROSS-REFERENCE TO RELATED APPLICATIONS

This application is a U.S. National Stage application of International Application No. PCT/CN2015/083689, filed on Jul. 9, 2015, which is hereby incorporated by reference in its entirety.

FIELD

The embodiments of the present invention relate to imaging technologies, and particularly, to an imaging method, an image sensor and an imaging device.

BACKGROUND

Image sensors have been used in imaging devices, for example, video cameras. Image sensors mainly support image capturing for visual ray light (400 nm-700 nm). These image sensors have color filters on chip. There are various Color Filter Array (CFA) patterns suited to each purpose. The most popular CFA pattern was invented by Mr. Bayer, and it is famous for a Bayer pattern or Bayer color filter. But recently, other CFA patterns have been proposed for sensing purpose.

To capture both Red Green Blue (RGB) image and Infrared (IR) image simultaneously, an RGB-IR image sensor is proposed. The RGB-IR image sensor is generally used for both taking photos and sensing. An RGB image is a photograph to be recorded, to be shared, to be appreciated and to be sensed by applications. So image quality of the RGB image is important. But an IR image is only for sensing iris recognition, Face Recognition and other sensing purpose. Therefore, an RGB-IR camera is usually used for taking photos and sensing something, and period of taking photos is not so long, but period of sensing may be very long.

Usually sensors of 8 megapixels or 13 megapixels consume from 200 mW to 300 mW. This power consumption is large to take IR images for sensing, which reduces battery life of a camera (or a camera phone).

Therefore, it is advantageous to provide an RGB-IR image sensor which can reduce the power consumption of the image sensor.

SUMMARY

Embodiments of the present invention provide an imaging method, an image sensor and an imaging device which can reduce the power consumption of the image sensor.

In a first aspect, there is provided an image sensor comprising: a filter array, a reading circuit, a controller, a converter and an image output interface, the controller is coupled to the reading circuit, the converter and the image output interface; wherein the filter array comprises a plurality of color filter array patterns, each color filter array pattern comprises color filters and at least one infrared (IR) filter; the color filters are configured to capture visible rays; the IR filters are configured to capture IR rays; the reading circuit is configured to read out IR signals from the IR filters only or read out IR signals from the IR filters and color signals from a part of the color filters under control of the controller; the converter is configured to convert the IR signals into IR digital signals under the control of the controller; the image output interface is configured to output the IR digital signals under the control of the controller.

In a first possible implementation of the image sensor according to the first aspect, the reading circuit comprises row selection circuit and column selection circuit, the row selection circuit is configured to skip filter rows in which no IR filter is located and select filter rows in which the IR filters are located when the image sensor enters an IR mode to sample signals from the selected filter rows, and the column selection circuit is configured to skip filter columns in which no IR filter is located and select filter columns in which the IR filters are located when the image sensor enters the IR mode to sample signals from the selected filter columns.

In a second possible implementation of the image sensor according to the first aspect, the reading circuit comprises row selection circuit and column selection circuit, the row selection circuit is configured to skip filter rows in which no IR filter is located and select filter rows in which IR filters are located when the image sensor enters an IR mode to sample signals from the selected filter rows, and the column selection circuit is configured to select all filter columns when the image sensor enters the IR mode to sample signals from the selected filter columns.

In a third possible implementation of the image sensor according to the first aspect or according to the any of the preceding implementations, the converter is further configured to convert the color signals into color digital signals under the control of the controller.

In a fourth possible implementation of the image sensor according to the first possible implementation, the image output interface is further configured to remove the multiple-color digital signals under the control of the controller.

In a fifth possible implementation of the image sensor according to the first aspect or according to the any of the preceding implementations, the image sensor has a plurality of units of shared pixel in each of which a plurality of pixels share a common circuit, and a size of each of the units of shared pixel is same as a size of each of the color filter array patterns.

In a sixth possible implementation of the image sensor according to the first aspect or according to any of the preceding implementations, the image sensor has a plurality of units of shared pixel in each of which a plurality of pixels shares a common circuit, and an integral multiplication of a size of each of the units of shared pixel is same as a size of each of the color filter array patterns.

In a seventh possible implementation of the image sensor according to the first aspect or according to any of the preceding implementations, the image sensor has a plurality of units of shared pixel in each of which a plurality of pixels shares a common circuit, and an integral multiplication of a size of each of the color filter array patterns is same as a size of each of the units of shared pixel.

In a second aspect, there is provided an imaging device comprising: an image sensor according to image sensor of the first aspect; a processor, configured to process infrared (IR) digital signals output from the image sensor.

In a third aspect, there is provided an imaging method, comprising: reading out infrared (IR) signals from IR filters of an image sensor only or reading out IR signals from IR filters and color signals from a part of color filters of an image sensor, wherein the image sensor comprises a plurality of color filter array patterns, each color filter array pattern comprises color filters and at least one IR filter, the color filters are configured to capture visible rays and the IR filters are configured to capture IR rays; converting the IR signals into IR digital signals; outputting the IR digital signals.

In a first possible implementation form of the imaging method according to the third aspect, the reading out infrared (IR) signals from IR filters of an image sensor only or reading out IR signals from IR filters and color signals from a part of color filters of an image sensor, comprises: skipping filter rows in which no IR filter is located and selecting filter rows in which IR filters are located when the image sensor enters an IR mode to sample signals from the selected filter rows; skipping filter columns in which no IR filter is located and select filter columns in which IR filters are located when the image sensor enters the IR mode to sample signals from the selected filter columns.

In a second possible implementation of the imaging method according to the third aspect, the reading out infrared (IR) signals from IR filters of an image sensor only or reading out IR signals from IR filters and color signals from a part of color filters of an image sensor, comprises: skipping filter rows in which no IR filter is located and selecting filter rows in which IR filters are located when the image sensor enters an IR mode to sample signals from the selected filter rows; selecting all filter columns when the image sensor enters the IR mode to sample signals from the selected filter columns.

In a third possible implementation of the imaging method according to the third aspect or according to the any of the preceding implementations, before outputting the IR digital signals, the imaging method further comprises: converting the color signals into color digital signals.

In a fourth possible implementation of the imaging method according to the third possible implementation, before outputting the IR digital signals, the imaging method further comprises: removing the multiple-color digital signals.

According to embodiments of the present invention, only the IR signals are read out from the IR filters in the image sensor, or IR signals are read out from the IR filters and color signals are read out from a part of the color filters in the image sensor. Since only the IR signals and at best a part of the color signals is read out, the frame rate of the image sensor is decreased and thus the power consumption of the whole image sensor is reduced.

BRIEF DESCRIPTION OF THE DRAWINGS

To illustrate technical solutions in embodiments of the present invention more clearly, a brief introduction on the accompanying drawings is given below. The accompanying drawings in the description below are merely some of the embodiments of the present invention, based on which other drawings can be acquired by the persons of ordinary skill in the art without any inventive effort.

DETAILED DESCRIPTION

Technical solutions in embodiments of the present invention will be described hereinafter with reference to the accompanying drawings. The described embodiments are merely part, but not all, of the embodiments of the present invention. All other embodiments, which can be derived by persons of ordinary skills in the art based on the embodiments of the present invention without any inventive efforts, shall fall into the protection scope of the present invention.

Generally, an RGB-IR image sensor may be used for both taking photos by RGB filters or pixels and sensing by IR filters or pixels. In a conventional RGB-IR image sensor, signals are read out from all the filters of the image sensor even if only the IR signals needs to be read out, which means that signals of filters which will not be used are also read out, and thus it spends useless power and useless period. Because the sensing usage is more popular, it is advantageous to reduce power consumption when only signals of IR filters need to be output from the image sensor. Therefore, a low power sensing mode that saves battery life is advantageous.

Embodiments of the present invention provide an RGB-IR image sensor which is designed to reduce power consumption of the image sensor when the image sensor works in an IR mode.

In embodiments of the present invention, unless otherwise specified, IR has the same meaning as Near Infrared (NIR).

Figure 1:
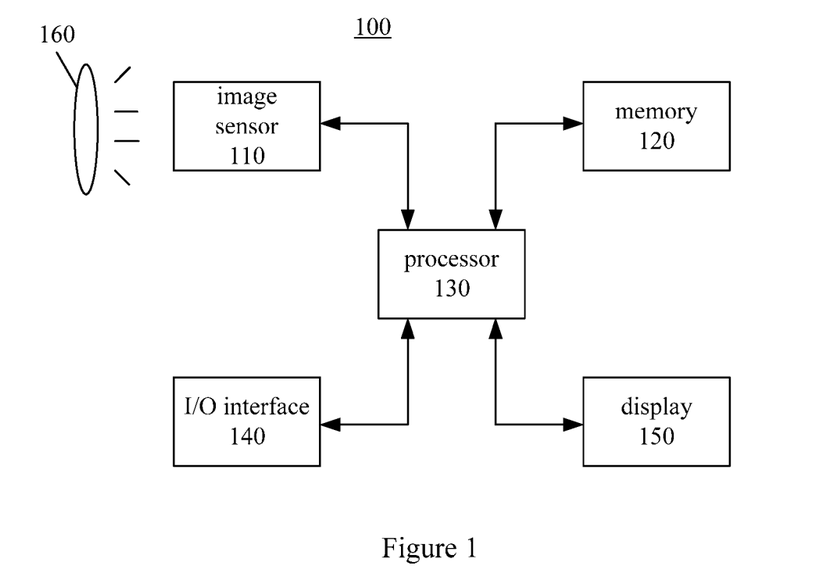
FIG. 1 is a block diagram illustrating major components of an imaging device 100 according to one embodiment of the present invention.

FIG. 1 is a block diagram illustrating major components of an imaging device 100 according to one embodiment of the present invention. The imaging device 100 includes an image sensor 110, a processor 130, a memory 120, an I/O interface 140 and a display 150.

The image sensor 110 may be also called an imaging sensor, which is a sensor that senses and conveys information of an image. The Image sensor 110 may be used in electronic imaging devices, which include digital cameras, camera modules, medical imaging equipment, night vision equipment such as thermal imaging devices, radar, sonar, and others. For example, the image sensor 110 may be an active pixel sensor in Complementary Metal Oxide Semiconductor (CMOS) or N-type Metal Oxide Semiconductor (NMOS) technologies, and the embodiments of the present invention are not limited thereto, for example, the image sensor 110 may be also a Charge-Coupled Device (CCD), or the like.

The image sensor 110 comprises color filters configured to capture visible rays from a light source 160 and IR filters configured to capture IR rays from the light source 160. The processor 130 is configured to determine whether the image sensor 110 enters an IR mode in which only IR signals need to be output. When the processor 130 determines that the image sensor 110 enters an IR mode, the processor 110 controls the image sensor 110 to read out IR signals from the IR filters. Alternatively, when the processor 130 determines that the image sensor 110 enters an IR mode, the processor 110 controls the image sensor 110 to read out IR signals from all the IR filters and color signals from a part of the color filters. The image sensor 110 outputs the IR signals only when the image sensor 110 enters the IR mode. The memory 120 is configured to store data corresponding to signals output by the image sensor 110. The display 150 is configured to display an image according to the data corresponding to signals output from the image sensor or stored in the memory 120. The I/O interface 140 is configured to communicate with other electronic devices, for example, a mobile phone, a smart phone, a phablet, a tablet, or a personal computer.

Optionally, when the image sensor enters in an RGB mode or RGB-IR mode, the image sensor may work as the conventional image sensor. For example, in this case, the signals are read out from all the filters or pixels of the image sensor.

According to embodiments of the present invention, the colors may correspond to RGB, and the embodiments of the present invention are not limited thereto. The colors may also correspond to other colors, for example, yellow, orange, or the like.

In addition to the above imaging device, it will be understood by those skilled in the art that the techniques disclosed herein are also applicable to other electronic devices with an imaging function, such as a mobile phone, a smart phone, a phablet, a tablet, a personal assistant, etc.

Figure 2:
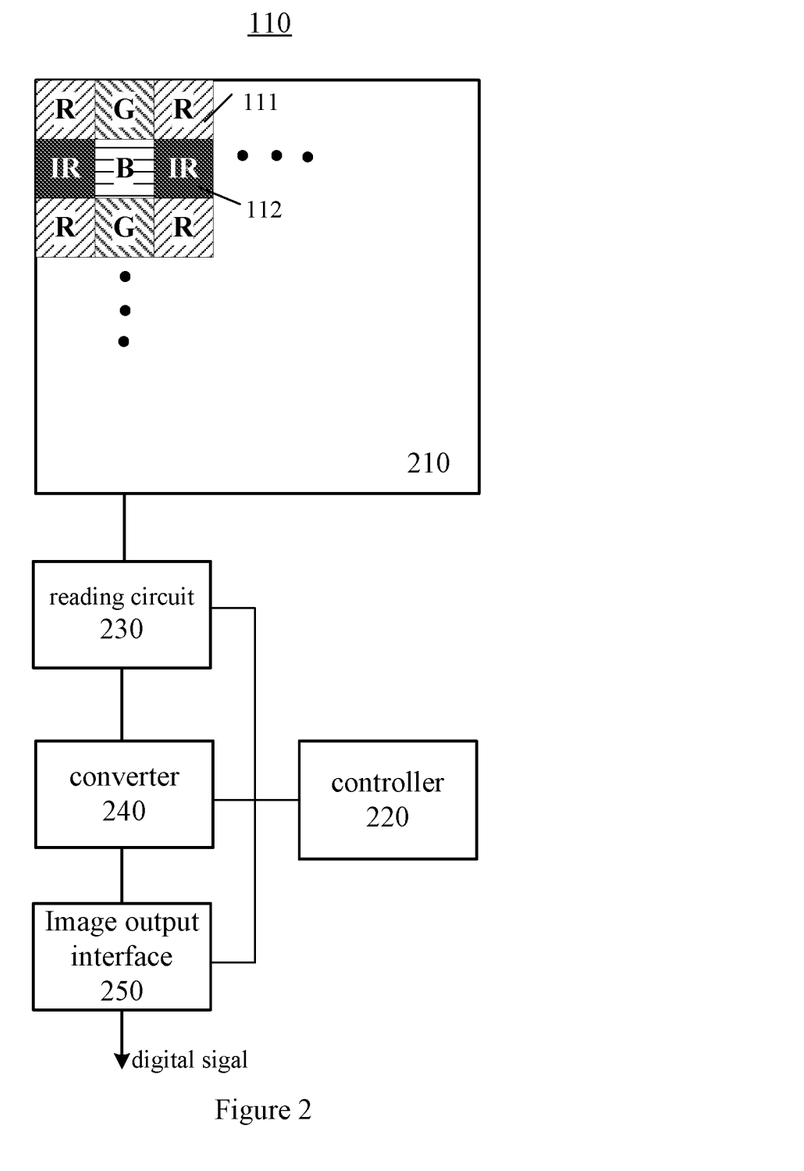
FIG. 2 is a block diagram illustrating major components of an image sensor 110 according to one embodiment of the present invention.

FIG. 2 is a block diagram illustrating major components of an image sensor 110 according to one embodiment of the present invention. The image sensor 110 includes a filter array 210, a reading circuit 230, a controller 220, a converter 240 and an image output interface 250.

The controller 220 is coupled to the reading circuit 230, the converter 240 and the image output interface 250. The filter array 210 comprises a plurality of color filter array patterns, and each color filter array pattern comprises color filters 111 and at least one infrared (IR) filter 112.

The color filters 111 are configured to capture visible rays and the IR filters 112 are configured to capture IR rays. The reading circuit 230 is configured to read out IR signals from the IR filters 112 only, or read out IR signals from the IR filters 112 and color signals from a part of the color filters 111 under control of the controller 220. The converter 240 is configured to convert the IR signals into IR digital signals under the control of the controller 220. The image output interface 250 is configured to output the IR digital signals under the control of the controller 220.

According to embodiments of the present invention, only the IR signals are read out from the IR filters in the image sensor, or IR signals are read out from the IR filters and color signals are read out from a part of the color filters in the image sensor. Since only the IR signals and at best a part of the color signals is read out, the frame rate of the image sensor is decreased and thus the power consumption of the whole image sensor is reduced.

According to the embodiment of the present invention, the reading circuit 230 includes a row selection circuit and a column selection circuit, the row selection circuit is configured to skip filter rows in which no IR filter is located and select filter rows in which the IR filters are located when the image sensor enters an IR mode to sample signals from the selected filter rows, and the column selection circuit is configured to skip filter columns in which no IR filter is located and select filter columns in which the IR filters are located when the image sensor enters the IR mode to sample the selected filter columns.

According to the embodiment of the present invention, the reading circuit 230 includes a row selection circuit and a column selection circuit, the row selection circuit is configured to skip filter rows in which no IR filter is located and select filter rows in which IR filters are located when the image sensor enters an IR mode to sample signals from the selected filter rows, and the column selection circuit is configured to select all filter columns when the image sensor enters the IR mode to sample signals from the selected filter columns. The embodiments of the present invention are not limited thereto, for example, the column selection circuit may select at least one part of filter columns when the image sensor enters the IR mode to sample signals from the selected filter columns. The at least one part of filter columns may include filter columns in which the IR filters are located and a part of filter columns in which no IR filter is located.

According to the embodiment of the present invention, the IR mode is used for the image sensor to output only IR signals, and RGB signals are not output from the image sensor. When the IR mode is active, only IR signals with minimum number of other signals are read out from filters of the image sensor.

In the image sensor, power mainly consumes in analog circuits, for example, an Analog-to-Digital Convertor (ADC) or other analog circuits. Since the power consumption of the ADC is usually proportional to conversion data rate of the ADC, an image with a higher resolution definition consumes higher power and a higher frame rate consumes higher power.

According to embodiments of the present invention, when an image sensor enters an IR mode, only the IR signals are read out from the IR filters in the image sensor, or IR signals are read out from the IR filters and color signals are read out from a part of the color filters in the image sensor. Since only the IR signals and at best a part of the color signals is read out, the frame rate of the image sensor is decreased and thus the power consumption of the whole image sensor is reduced.

In the IR mode, all or almost all the internal circuit should work dedicated to IR signal output. Because main portion of power consumption is the ADC circuit and an interface (I/F) circuit in the image sensor, to reduce power consumption, it is effective to reduce activity ratio (also called availability ratio or operation ratio) of the image sensor and stop power supply to some function circuit, such as internal circuits and I/F circuit. To reduce the activity ratio of image sensor, it is best way to reduce the number of vertical lines from which signals are to be read out and reduce a number of pixels from which signals are to be read out and output. It reduces current supply or working period of the ADC and other circuits.

The above solution to reduce activity ratio can make some channels/lanes of the image sensor disable. If the number of lanes of the image sensor is lower, some lanes that are not used can be disabled. If the bit rate of the image sensor is lower, period of LP mode (low power mode) may be expended. As the result, power consumption will be reduced.

Optionally, as another embodiment of the present invention, the converter 240 is further configured to convert the color signals into color digital signals under the control of the controller.

In the case that IR signals are read out from the IR filters and color signals are read out from a part of the color filters in the image sensor, the converter 240 may convert the color signals into color digital signals and the IR signals into IR digital signals.

Optionally, as another embodiment of the present invention, the image output interface 250 is further configured to remove the multiple-color digital signals under the control of the controller.

In the case that IR signals are read out from the IR filters and color signals are read out from a part of the color filters in the image sensor, the image output interface 250 may remove the color digital signals by means of a gate function and output IR digital signals.

It should be understood for those skilled in the art that the filter array may be arranged between a micro lens layer and a pixel layer. For convenience and simplicity of description, details of the micro lens layer and the pixel layer will not be described herein.

Figure 3:
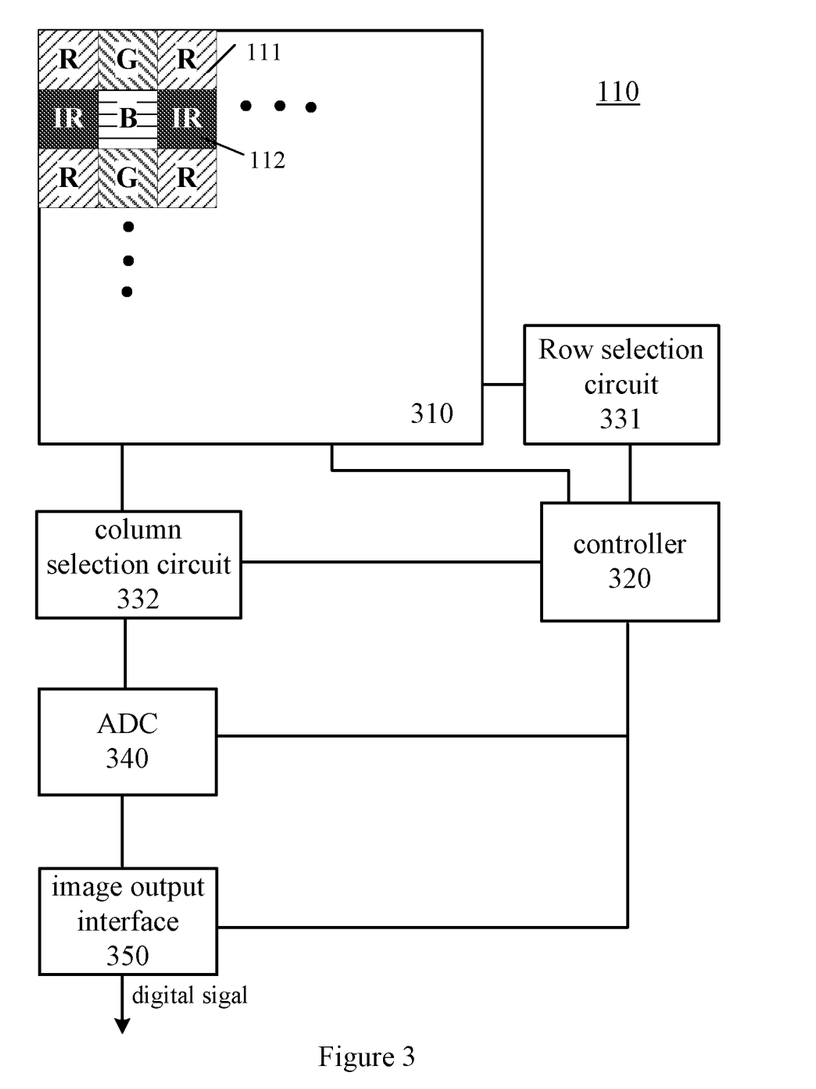
FIG. 3 is a block diagram illustrating major components of an image sensor 110 according to another embodiment of the present invention.

FIG. 3 is a block diagram illustrating major components of an image sensor 110 according to another embodiment of the present invention.

The image sensor 110 includes a filter array 310, row selection circuit 331, a controller 320, column selection circuit 332, an image output interface 350 and an ADC 340. The controller 320 is coupled to the row selection circuit 331, the column selection circuit 332, the image output interface 350, and the ADC 340, and controls the operation of them. Optionally, the controller 320 is also coupled to the filter array 310.

According to embodiments of the present invention, the filter array 310 includes a plurality of filter rows and a plurality of filter columns. The row selection circuit 331 includes a plurality of row selectors corresponding to the plurality of filter rows. The column selection circuit 332 includes a plurality of column amplifiers corresponding to the plurality of filter columns.

Specifically, when the image sensor enters the IR mode, the controller controls row selectors to select filter rows in which IR filters 112 are located and controls the amplifiers to select the filter columns. In this case, only the signals from all the IR filters and the color filters located in the same row as the IR filters are read out. The plurality of row selectors and the plurality of column amplifiers are configured to skip filter rows and filter columns in which no IR filter is located, and sample signals from filter rows and filter columns in which the IR filters are located.

Specifically, when the image sensor enters the IR mode, the controller controls row selectors and column amplifiers to read out the signals from filter rows and filter columns in which IR filters 112 are located. In this case, only IR signals in the filter rows and filter columns are read out, or only the signals from all the IR filters and the color filters located in the same row as the IR filters and located in the same column as the IR filters are read out.

Optionally, as another embodiment of the present invention, the image sensor 111 further includes: an ADC 340. The ADC 340 is configured to convert the IR signals into digital signals when the image sensor enters the IR mode, wherein the image output interface 350 is configured to output the IR digital signals.

Specifically, in the case that only the IR signals are read out from the IR filters, the ADC 340 of the image sensor converts the IR signals into digital signals and the image output interface 350 outputs the digital signals. For example, the image output interface 350 may be implemented by a multiplexer or a selector.

Optionally, as another embodiment of the present invention, the image sensor 111 further includes: an ADC 340, configured to convert the IR signals and the color signals into digital signals, wherein the image output interface 350 is configured to remove digital signals converted from the color signals by means of a gate function, and output digital signals converted from the IR signals.

Specifically, in the case that the signals are read out from all the IR filters and a part of the color filters, the ADC 340 of the image sensor converts the signals into digital signals, the image output interface 350 removes digital signals converted from the color signals by means of a gate function and outputs digital signals converted from the IR signals only. For example, the gate function may be implemented by software and hardware.

It should be understood for those skilled in the art that the remove function may also be implemented by the controller of the image sensor.

According to embodiments of the present invention, each filter may include a pixel circuit which includes Metal-Oxide-Semiconductor Field Effect Transistors (MOSFETS) and a photodiode configured in a conventional manner known to those skilled in the art.

According to embodiments of the present invention, the filter array comprises a plurality of Color Filter Arrays (CFA) patterns, and each of the CFA patterns comprises color filters and at least one IR filter.

Figure 4:
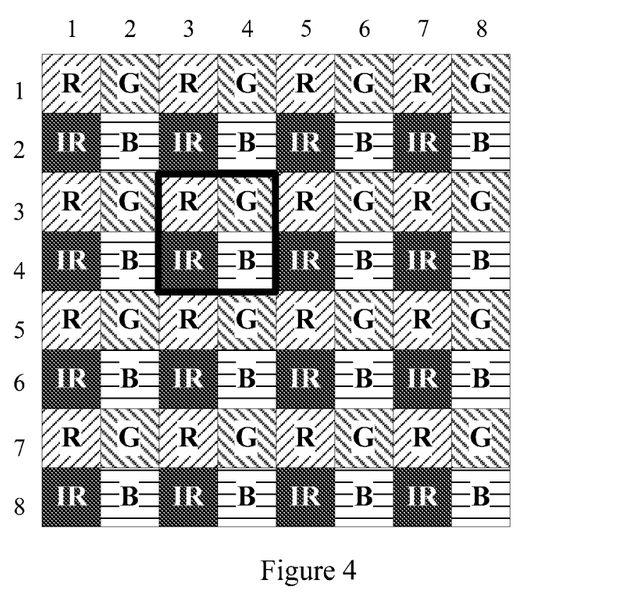
FIG. 4 is a schematic diagram illustrating a filter array of the image sensor 110 according to another embodiment of the present invention.

FIG. 4 is a schematic diagram illustrating a filter array of the image sensor 110 according to another embodiment of the present invention. Referring to FIG. 4, the filter array includes a plurality of repeated CFA patterns. Each CFA pattern includes an R filter, a G filter, a B filter and an IR filter. For example, filters in rows 3-4 and columns 3-4 in a CFA pattern in FIG. 4 include an R filter, a G filter, a B filter and an IR filter.

According to embodiments of the present invention, the image sensor may have a plurality of units of shared pixel in each of which a plurality of pixels share a common circuit, and a size of each of the units of shared pixel is same as a size of each of the CFA patterns.

According to embodiments of the present invention, the image sensor may have a plurality of units of shared pixel in each of which a plurality of pixels shares a common circuit, and an integral multiplication of a size of each of the units of shared pixel is same as a size of each of the CFA patterns.

According to embodiments of the present invention, the image sensor may have a plurality of units of shared pixel in each of which a plurality of pixels shares a common circuit, and an integral multiplication of a size of each of the CFA patterns is same as a size of each of the units of shared pixel.

To reduce pixel size, it is best way to reduce the quantity of transistors in a pixel in an image sensor. To reduce the quantity of transistors, some transistors can be shared by multiple pixels. For example, 3 transistors and a floating diffusion region are shared by 4 pixels, i.e., 2 by 2 pixels. The embodiments of the present invention are not limited thereto, other kinds of shared pixel structure are proposed, for example, Zigzag, 1 by 2, 1 by 4, 2 by 4 and etc. This is called "Unit of Shared pixel". The signals of pixels in a same location of different Units of Shared pixels are usually designed to be read out simultaneously.

Specifically, integral multiplication of size of a unit of shared pixel is selected as size of a CFA pattern (case A) or integral multiplication of size of a CFA pattern is selected as size of a unit of shared pixel (case B). From image sensor design point of view, it is better to reduce complexity of design. If neither case A nor case B is achieved, IR lines appear non-periodically and the design will be complicated. Both horizontal size and vertical size may satisfy this requirement. In case A, add a function which can remove a signal which is not an IR signal from data read out from the image sensor. To satisfy this requirement, wires in an imaging area of the shared pixel structure can be used to skip filters and read out signals of filters.

According to embodiments of the present invention, the color filters include Red, Blue, and Green RGB filters, the color signals are RGB signals.

To output signals from an image sensor, there are some modes for reading out signals, for example, a full pixel mode in which the image sensor reads out signals of filters corresponding to all the pixels that the image sensor has, and an elimination mode in which a part of signals of filters corresponding to all the pixels is read out. The elimination mode includes a cropping mode, a sub-sampling mode and a binning mode. In the cropping mode, the image sensor outputs signals of filters corresponding to all pixels in a region that is set to be output. In the sub-sampling mode, the image sensor outputs signals of filters in a rule that is set to be output—skip to read out some signals of filters in the vertical lines and horizontal lines. The cropping mode and the sub-sampling mode may be modified to implement the embodiment of the present invention. For example, when using the cropping mode, only the regions in which signals of IR filters are located are set to be output from the image sensor, and when using the sub-sampling mode, the rule of reading out the signals of filters of the image sensor includes skipping to read out the filters in the vertical lines (columns) and horizontal lines (rows) in which IR filters are located. Using the elimination mode, the frame rate of the image sensor increases and thus power consumption of the image sensor is reduced.

There are many kinds of CFA patterns which include IR filters. The CFA pattern may be 2 filters by 2 filters (2×2), 4 filters by 4 filters (4×4) or other size of CFA pattern. When the image sensor includes such a CFA pattern, IR rays mainly passes some part(s) of the CFA pattern.

Figure 5:
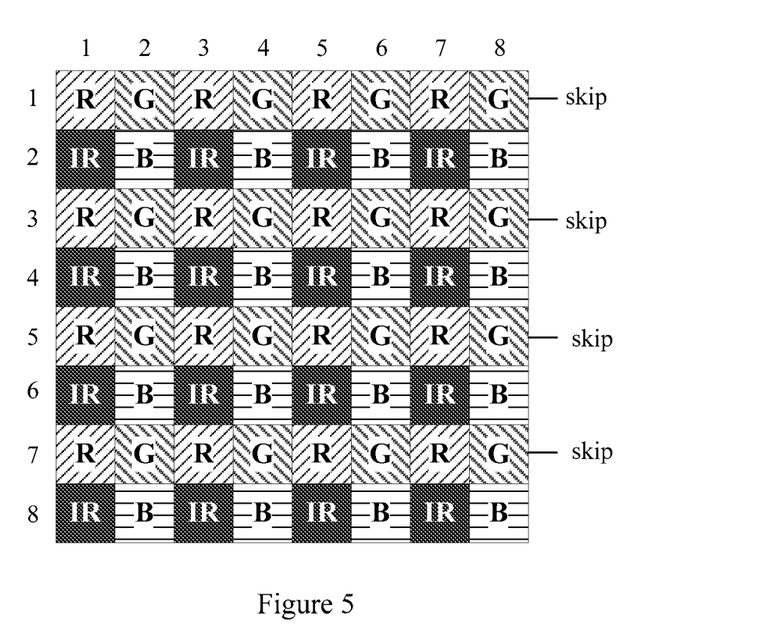
FIG. 5 is a schematic diagram illustrating a filter array of an image sensor according to another embodiment of the present invention.

FIG. 5 is a schematic diagram illustrating a filter array of an image sensor according to another embodiment of the present invention.

FIG. 5 shows an example of a 2×2 CFA pattern. For example, a 2×2 CFA pattern includes an IR filter, a G filter, a B filter and an R filter, for example, filters in columns 3-4 and rows 3-4 in FIG. 5, and there is a plurality of CFA patterns repeated in the image sensor. The 2×2 CFA pattern includes an IR filter, a G filter, a B filter and an R filter, the IR filter and the G filter are arranged diagonally, and the B filter and the R filter are arranged diagonally.

When the image sensor 110 enters the IR mode, the controller controls the row selection circuit 331 to skip filter rows in which no IR filter is located and select filter rows in which IR filters are located, and controls the column selection circuit 332 to select all filters to sample signals from filter rows in which IR filters 112 are located. Referring to FIG. 5, the IR filters are distributed in even rows and odd columns, and all the filters located in even rows and odd columns are IR filters. When the image sensor 110 enters the IR mode, one row is selected, and the next row is skipped alternatively. For example, row 1 is skipped, row 2 is selected, row 3 is skipped, row 4 is selected, and so on.

Figure 6:
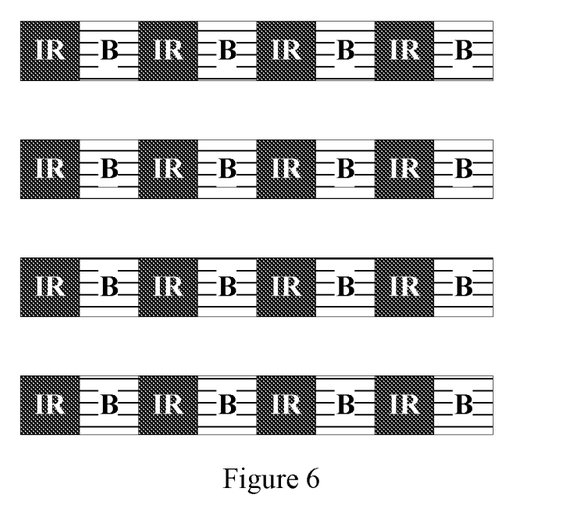
FIG. 6 is a schematic diagram illustrating a distribution of the filters of which signals are read out according to the embodiment of FIG. 5.

FIG. 6 is a schematic diagram illustrating a distribution of the filters of which signals are read out according to the embodiment of FIG. 5. Referring to FIG. 6, only signals generated by the filters in even rows are read out, and signals generated by the filters in the other rows (odd rows) are not read out. In this case, IR signals are read out from all the IR filters and B signals are read out from the B filters in even rows and even columns, but signals of R filter and G filter are not read out.

Figure 7:
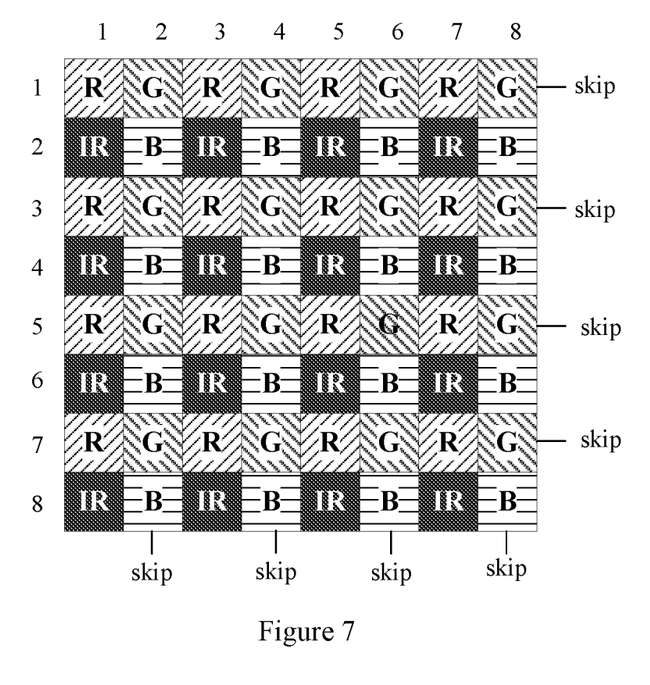
FIG. 7 is a schematic diagram illustrating a filter array of the image sensor according to another embodiment of the present invention.

FIG. 7 is a schematic diagram illustrating a filter array of the image sensor according to another embodiment of the present invention.

When the image sensor 110 enters the IR mode, the controller 320 controls the row selection circuit 331 to skip filter rows in which no IR filter is located and select filter rows in which IR filters are located, and controls the column selection circuit 332 to skip filter columns in which no IR filter is located and select filter columns in which IR filters are located to sample signals from filter rows and filter columns in which IR filters are located. Referring to FIG. 7, the IR filters are distributed in even rows and odd columns, and all the filters in even rows and odd columns are IR filters. When the image sensor 110 enters the IR mode, as to filter of rows, one row is selected, the next row is skipped alternatively, for example, row 1 is skipped, row 2 is selected, row 3 is skipped, row 4 is selected, and so on, and as to filters of columns, one column is selected, the next column is skipped, for example, column 1 is selected, column 2 is skipped, column 3 is selected, column 4 is skipped, and so on.

Figure 8:
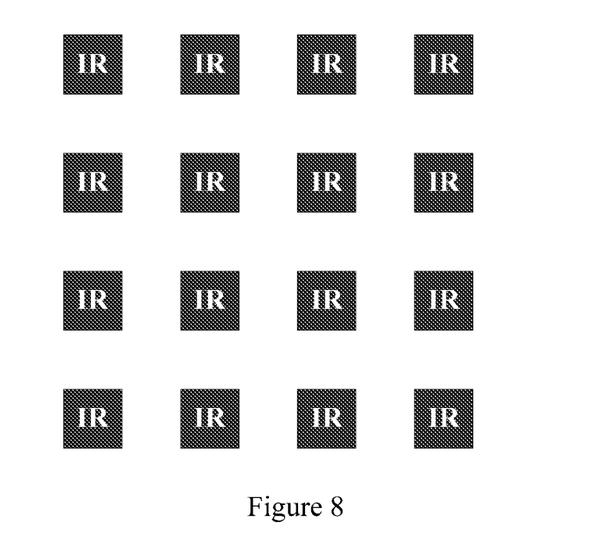
FIG. 8 is a schematic diagram illustrating a distribution of the filters read out according to the embodiment of FIG. 7.

FIG. 8 is a schematic diagram illustrating a distribution of the filters read out according to the embodiment of FIG. 7.

Referring to FIG. 8, only signals generated by the filters in even rows and odd columns are read out, and signals generated by the filters in the other rows or columns (odd rows or even columns) are not read out. In this case, only IR signals are read out from the IR filters, but all the RGB filters are not read out.

Figure 9:
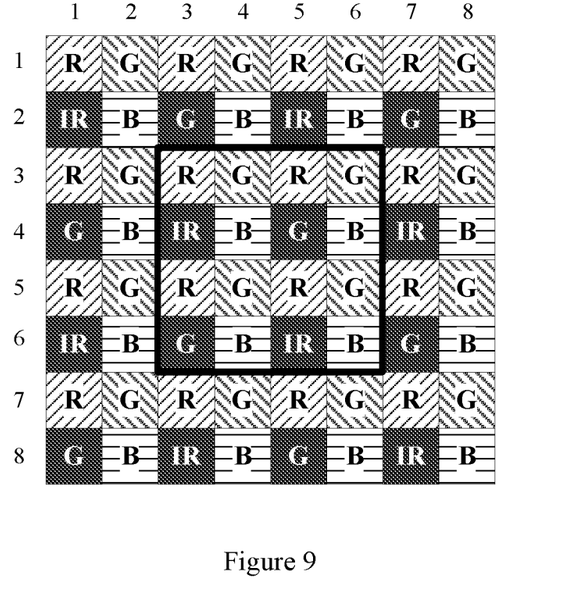
FIG. 9 is a schematic diagram illustrating a filter array of the image sensor 110 according to another embodiment of the present invention.

FIG. 9 is a schematic diagram illustrating a filter array of the image sensor 110 according to another embodiment of the present invention.

FIG. 9 shows an example of a 4×4 CFA pattern. For example, the 4×4 CFA pattern includes filters in columns 3-6 and rows 3-6 and there is a plurality of CFA patterns repeated in the image sensor. The 4×4 CFA pattern includes two first sub-patterns arranged diagonally and two second sub-patterns arranged diagonally. The first sub-pattern is identical to the above 2×2 CFA pattern, and the second sub-pattern is identical to the above 2×2 CFA pattern with the IR filter in the 2×2 pattern replaced with the G filter.

Similar as described in FIGS. 5 and 6, when the image sensor 110 enters the IR mode, the controller 320 controls the row selection circuit 331 to skip filter rows in which no IR filter is located and select filter rows in which IR filters are located, and controls the column selection circuit 332 to select all filter columns in which IR filters are located to sample signals from filter rows in which IR filters 112 are located. Referring to FIG. 9, the IR filters are distributed in even rows and odd columns. Different from the filter array in FIG. 5, not all the filters in even rows and odd columns are IR filters, for example, in rows 2 and 6, the filters in columns 3 and 7 are Green (G) filters, and in rows 4 and 8, the filters in columns 1 and 5 are G filters. When the image sensor 110 enters the IR mode, one row is selected, and the next row is skipped alternatively, for example, row 1 is skipped, row 2 is selected, row 3 is skipped, row 4 is selected, and so on.

Figure 10:
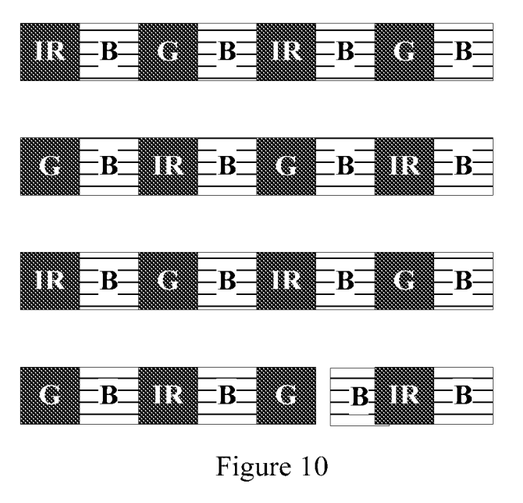
FIG. 10 is a schematic diagram illustrating a distribution of the filters of which signals are read out according to the embodiment of FIG. 9.

FIG. 10 is a schematic diagram illustrating a distribution of the filters read out according to the embodiment of FIG. 9.

Referring to FIG. 10, only signals generated by the filters of even rows are read out, and signals generated by the filters of the other rows (odd rows) are not read out. In this case, all the IR signals are read out from all the IR filters in even rows and odd columns, some G signals are read out from the G filters in even rows and odd columns, and some B signals are read out from the B filters in even rows and even columns.

When the image sensor 110 enters the IR mode, the controller 320 controls the row selection circuit 331 to skip filter rows in which no IR filter is located and select filter rows in which IR filters are located, and controls the column selection circuit to skip filter columns in which no IR filter is located and select filter columns in which IR filters are located to sample signals from filter rows and filter columns in which IR filters are located. Referring to FIG. 9, the IR filters are distributed in even rows and odd columns. When the image sensor 110 enters the IR mode, as to filter of rows, one row is selected, the next row is skipped alternatively, for example, row 1 is skipped, row 2 is selected, row 3 is skipped, row 4 is selected, and so on, and as to filters of columns, one column is read out, the next column is skipped, for example, column 1 is selected, column 2 is skipped, column 3 is selected, column 4 is skipped, and so on.

Figure 11:
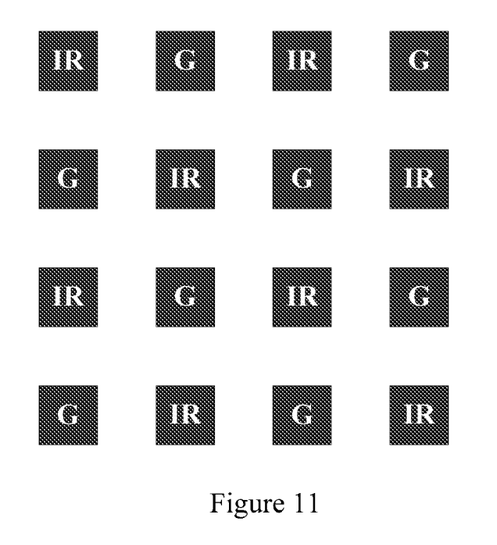
FIG. 11 is a schematic diagram illustrating another distribution of the filters of which signals are read out according to the embodiment of FIG. 9.

FIG. 11 is a schematic diagram illustrating another distribution of the filters of which signals are read out according to the embodiment of FIG. 9.

Referring to FIG. 11, only signals generated by the filters in even rows and odd columns are read out, and signals generated by the filters of the other rows or columns (odd rows or even columns) are not read out. In this case, all the IR signals are read out from the IR filters in even rows and odd columns, and some G signals are read out from the G filters in even rows and odd columns.

Figure 12:
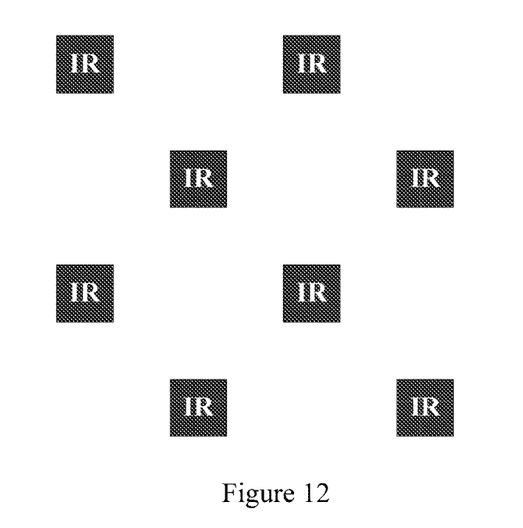
FIG. 12 is a schematic diagram illustrating a distribution of the filters of which signals are read out according to the embodiment of FIG. 9.

FIG. 12 is a schematic diagram illustrating a distribution of the filters of which signals are read out according to the embodiment of FIG. 9.

After reading circuit reads out the signals according to the embodiment of FIG. 11, the ADC 340 may convert IR signals and G signals read out from filters in even rows and odd columns into IR digital signals and G digital signals under the control of the controller 320. The image output interface 350 may remove G digital signals by a gate function and output the IR digital signals. In this case, only the IR signals read out from the IR filters in even rows and odd columns are remained to be output.

Alternatively, to minimize power consumption, other complicated method for reading out IR signals from the IR filters might be better. For example, signals generated by the filters as shown in FIGS. 8 and 12 may be directly read out by controlling the row selection circuit and column selection circuit. In other words, a signal of each filter may be directly read out by controlling a row decoder and a column amplifier corresponding to the filter.

Optionally, as another embodiment of the present invention, the power consumption of the image sensor may be further reduced by reducing the power consumption of the interface (I/F). For example, when the image sensor enters the IR mode, the number of lanes of the image sensor may be decreased down to the number which can satisfy band width of I/F. In addition, the power consumption of the image sensor may be further reduced by decreasing the voltage of an analogue circuit of the image sensor, optimizing an ADC of the image sensor to reduce the power consumption of the ADC, or decreasing the frame rate of the image sensor and optimizing the current of a circuit of the image sensor.

Figure 13:
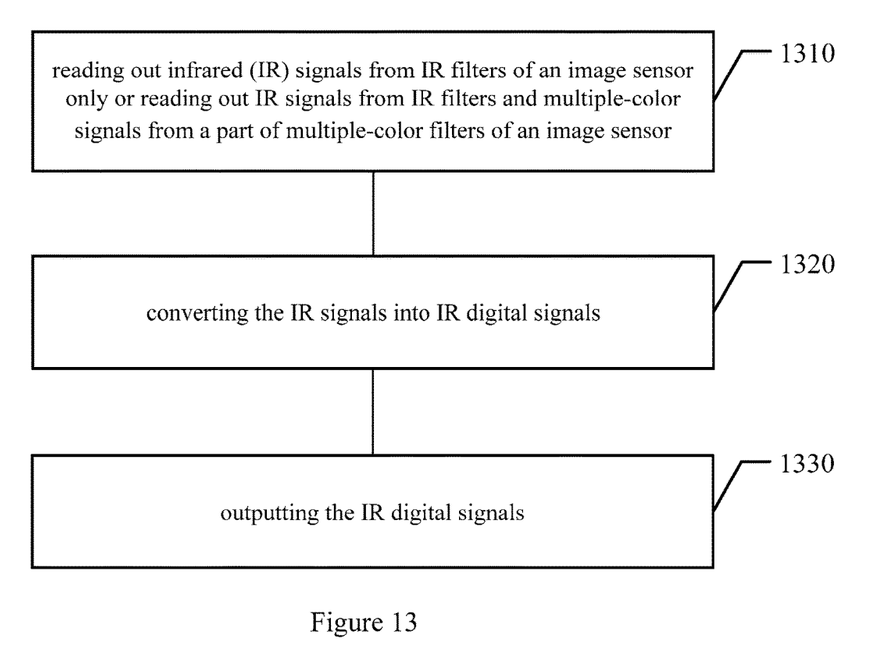
FIG. 13 is a flow diagram illustrating an imaging method according to one embodiment of the present invention.

FIG. 13 is a flow diagram illustrating an imaging method according to one embodiment of the present invention. The imaging method is implemented by an imaging device. The imaging method includes:

1310, reading out infrared (IR) signals from IR filters of an image sensor only or reading out IR signals from IR filters and color signals from a part of color filters of an image sensor, wherein the image sensor comprises a plurality of color filter array (CFA) patterns, each color filter array pattern comprises color filters and at least one IR filter, the color filters are configured to capture visible rays and the IR filters are configured to capture IR rays.

1320, converting the IR signals into IR digital signals.

1330, outputting the IR digital signals.

According to embodiments of the present invention, only the IR signals are read out from the IR filters in the image sensor, or IR signals are read out from the IR filters and color signals are read out from a part of the color filters in the image sensor. Since only the IR signals and at best a part of the color signals is read out, the frame rate of the image sensor is decreased and thus the power consumption of the whole image sensor is reduced.

According to embodiments of the present invention, step 1310 includes: skipping filter rows in which no IR filter is located and selecting filter rows in which IR filters are located when the image sensor enters an IR mode to sample signals from the selected filter rows; skipping filter columns in which no IR filter is located and selecting filter columns in which IR filters are located when the image sensor enters the IR mode to sample signals from the selected filter columns.

According to embodiments of the present invention, step 1310 includes: skipping filter rows in which no IR filter is located and selecting filter rows in which IR filters are located when the image sensor enters an IR mode to sample signals from the selected filter rows; selecting all filter columns when the image sensor enters the IR mode to sample signals from the selected filter columns.

Optionally, as another embodiment of the present invention, before outputting the IR digital signals, the imaging method further comprises: converting the color signals into color digital signals.

Optionally, as another embodiment of the present invention, before outputting the IR digital signals, the imaging method further comprises: removing the multiple-color digital signals.

According to embodiments of the present invention, the image sensor has a plurality of units of shared pixel in each of which a plurality of filters share a common circuit, and a size of each of the units of shared pixel is same as a size of each of the CFA patterns.

According to embodiments of the present invention, the image sensor has a plurality of units of shared pixel in each of which a plurality of filters shares a common circuit, and an integral multiplication of a size of each of the units of shared pixel is same as a size of each of the CFA patterns.

According to embodiments of the present invention, the image sensor has a plurality of units of shared pixel in each of which a plurality of filters shares a common circuit, and an integral multiplication of a size of each of the CFA patterns is same as a size of each of the units of shared pixel.

According to embodiments of the present invention, the color filters include Red, Blue, and Green (RGB) filters, and the color signals are RGB signals.

The persons of ordinary skills in the art may realize that the units and steps of algorithm of the respective examples, described with reference to the embodiments disclosed in the text, can be accomplished by electronic hardware, or a combination of computer software and electronic hardware. The person skilled in the art may accomplish the described functions by adopting a different method for each specific application, but this kind of accomplishment shall not go beyond the scope of the present invention.

Those skilled in the art may understand clearly that, for convenience and simplicity of description, specific working processes of the above-described systems, apparatus and units may be referred to corresponding processes in the aforementioned embodiments of the methods, and will not be described repeatedly herein.

In several embodiments provided by the present application, it shall be understood that disclosed systems, apparatus and methods may be implemented by other manners. For example, the embodiments of the apparatus described above are just illustrative. For example, division of the units is just a kind of division according to logical functions, and there may be other division manners for practical implementations. For example, a plurality of units or components may be combined or integrated into another system, or some features may be neglected or may not be performed.

The units described as separated parts may be, or may not be, physically separated, and the parts shown as units may be physical units, which may be located in one place or distributed to a plurality of network elements. Part or all units therein may be selected, according to an actual need, to implement the objective of solutions provided in the present disclosure.

In addition, the respective functional units in the respective embodiments of the present invention may be integrated into one processing unit, or the respective units may exist separately and physically, or, two or more units may be integrated into one unit.

If the function is implemented in the form of a software functional unit and is sold or used as an independent product, the function may be stored in a computer readable storage medium. Based on this understanding, or the parts that make contributions to the prior art, of the technical solution in the present disclosure may be embodied in the form of a software product. The computer software product is stored in a storage medium, and includes a number of instructions that enable a computer device (may be a personal computer, a server, or a network device) to execute all or part of steps of the method described in the respective embodiments of the present invention. The preceding storage mediums includes various mediums that can store program codes, such as, a U disk, a removable hard disk, a read-only memory (ROM), a random access memory (RAM), a magnetic disk, an optical disk, or the like.

The foregoing descriptions are merely specific embodiments of the invention, rather than limiting the protection scope of the invention. It is easy for any one skilled in the art to conceive changes or substitutions within the technical scope disclosed by the invention, and the changes or substitutions shall fall in the protection scope of the invention. Therefore, the protection scope of the present invention shall be defined by the claims. Additionally, statements made herein characterizing the invention refer to an embodiment of the invention and not necessarily all embodiments.

What is claimed is:

1. An image sensor, comprising:
a filter array;
a reading circuit;
a controller;
a converter; and
an image output interface;
wherein the controller is coupled to the reading circuit, the converter and the image output interface;
wherein the filter array comprises a plurality of color filter array patterns, each color filter array pattern comprising color filters and at least one infrared (IR) filter, wherein each color filter array pattern comprises a first row comprising only color filters and no IR filters, a second row comprising both at least one color filter and at least one IR filter, a first column comprising at least one color filter and at least one IR filter, and a second column comprising only color filters and no IR filters;
wherein the color filters are configured to capture visible rays;
wherein the at least one IR filter is configured to capture IR rays;
wherein the reading circuit is configured to read out IR signals from the at least one IR filter and/or color signals from the color filters under control of the controller;
wherein the converter is configured to convert the IR signals into IR digital signals under the control of the controller; and
wherein the image output interface is configured to output the IR digital signals under the control of the controller;
wherein the controller is configured to operate the image sensor in multiple modes of operation, including a multiple-color mode and an IR mode, wherein operating the image sensor in the IR mode causes IR signals to be read out from all IR filters of the filter array and color signals to be read out from some but not all color filters of the filter array, and wherein operating the image sensor in the IR mode consumes less power relative to operating the image sensor in the multiple-color mode, wherein operating the image sensor in the multiple-color mode includes reading out color signals from all color filters of the filter array;
wherein the reading circuit comprises a row selection circuit and a column selection circuit, wherein during operation in the IR mode:
the row selection circuit is configured to skip filter rows in which no IR filter is located and select filter rows in which IR filters are located when the image sensor enters the IR mode to sample signals from the selected filter rows; and
the column selection circuit is configured to select all filter columns when the image sensor enters the IR mode to sample signals from all filter columns.

2. The image sensor according to claim 1, wherein the converter is further configured to convert the color signals into color digital signals under the control of the controller.

3. The image sensor according to claim 2, wherein the image output interface is further configured to remove the color digital signals under the control of the controller.

4. The image sensor according to claim 1, wherein the image sensor has a plurality of units of shared pixel, wherein each unit of shared pixel comprises a plurality of pixels sharing a common circuit, and a size of each of the units of shared pixel is the same as a size of each of the color filter array patterns.

5. The image sensor according to claim 1, wherein the image sensor has a plurality of units of shared pixel, wherein each unit of shared pixel comprises a plurality of pixels sharing a common circuit, and an integral multiplication of a size of each of the units of shared pixel is the same as a size of each of the color filter array patterns.

6. The image sensor according to claim 1, wherein the image sensor has a plurality of units of shared pixel, wherein each unit of shared pixel comprises a plurality of pixels sharing a common circuit, and an integral multiplication of a size of each of the color filter array patterns is the same as a size of each of the units of shared pixel.

7. An image device, comprising:
an image sensor comprising a filter array, a reading circuit, a controller, a converter and an image output interface, wherein the controller is coupled to the reading circuit, the converter and the image output interface, wherein:
the filter array comprises a plurality of color filter array patterns, each color filter array pattern comprising color filters and at least one infrared (IR) filter, wherein each color filter array pattern comprises a first row comprising only color filters and no IR filters, a second row comprising both at least one color filter and at least one IR filter, a first column comprising at least one color filter and at least one IR filter, and a second column comprising only color filters and no IR filters;
the color filters are configured to capture visible rays;
the at least one IR filter is configured to capture IR rays;
the reading circuit is configured to read out IR signals from the at least one IR filter and/or color signals from the color filters under control of the controller;
the converter is configured to convert the IR signals into IR digital signals under the control of the controller; and
the image output interface is configured to output the IR digital signals under the control of the controller; and
the controller is configured to operate the image sensor in multiple modes of operation, including a multiple-color mode and an IR mode, wherein operating the image sensor in the IR mode causes IR signals to be read out from all IR filters of the filter array and color signals to be read out from some but not all color filters of the filter array, and wherein operating the image sensor in the IR mode consumes less power relative to operating the image sensor in the multiple-color mode, wherein operating the image sensor in the multiple-color mode includes reading out color signals from all color filters of the filter array; and
a processor, configured to process the IR digital signals;
wherein the reading circuit comprises a row selection circuit and a column selection circuit, wherein during operation in the IR mode:
the row selection circuit is configured to skip filter rows in which no IR filter is located and select filter rows in which IR filters are located when the image sensor enters the IR mode to sample signals from the selected filter rows; and
the column selection circuit is configured to select all filter columns when the image sensor enters the IR mode to sample signals from all filter columns.

8. The image device according to claim 7, wherein the converter is further configured to convert the color signals into color digital signals under the control of the controller.

9. The image device according to claim 8, wherein the image output interface is further configured to remove the color digital signals under the control of the controller.

10. The image device according to claim 7, wherein the image sensor has a plurality of units of shared pixel, wherein each unit of shared pixel comprises a plurality of pixels sharing a common circuit, and a size of each of the units of shared pixel is the same as a size of each of the color filter array patterns.

11. The image device according to claim 7, wherein the image sensor has a plurality of units of shared pixel, wherein each unit of shared pixel comprises a plurality of pixels sharing a common circuit, and an integral multiplication of a size of each of the units of shared pixel is the same as a size of each of the color filter array patterns.

12. The image device according to claim 7, wherein the image sensor has a plurality of units of shared pixel, wherein each unit of shared pixel comprises a plurality of pixels sharing a common circuit, and an integral multiplication of a size of each of the color filter array patterns is the same as a size of each of the units of shared pixel.

13. The image device according to claim 7, wherein the image device is a phone or a camera.

14. An imaging method, comprising:
reading out, by an image sensor, infrared (IR) signals from all IR filters of the image sensor and color signals from some but not all color filters of the image sensor during operation of the image sensor in an IR mode, and reading out, by the image sensor, color signals from all color filters of the image sensor during operation of the image sensor in a multiple-color mode, wherein the image sensor comprises a plurality of color filter array patterns, wherein each color filter array pattern comprises color filters and at least one IR filter, wherein each color filter array pattern comprises a first row comprising only color filters and no IR filters, a second row comprising both at least one color filter and at least one IR filter, a first column comprising at least one color filter and at least one IR filter, and a second column comprising only color filters and no IR filters, wherein the color filters are configured to capture visible rays, wherein the at least one IR filter is configured to capture IR rays, and wherein operating the image sensor in the IR mode consumes less power relative to operating the image sensor in the multiple-color mode;
converting, by the image sensor, the IR signals into IR digital signals; and
outputting, by the image sensor, the IR digital signals;
wherein reading out IR signals from all IR filters of the image sensor and color signals from some but not all color filters of the image sensor during operation of the image sensor in the IR mode comprises:
using a row selection circuit to skip filter rows in which no IR filter is located and select filter rows in which IR filters are located when the image sensor enters the IR mode to sample signals from the selected filter rows; and
using a column selection circuit to select all filter columns when the image sensor enters the IR mode to sample signals from all filter columns.

15. The imaging method according to claim 14, wherein before outputting the IR digital signals, the method further comprises:
converting the color signals into color digital signals.

16. The imaging method according to claim 15, wherein before outputting the IR digital signals, the method further comprises:
removing the color digital signals.

* * * * *